United States Patent [19]
Williams et al.

[11] Patent Number: 5,801,643
[45] Date of Patent: Sep. 1, 1998

[54] REMOTE UTILITY METER READING SYSTEM

[75] Inventors: Roger B. Williams, Lake Zurich; Thomas E. Szmurlo, Palatine; Warren E. Guthrie, Wheaton; James Jensen, Palatine, all of Ill.

[73] Assignee: Northrop Grumman Corporation, Los Angeles, Calif.

[21] Appl. No.: 801,407

[22] Filed: Feb. 20, 1997

Related U.S. Application Data

[63] Continuation-in-part of Ser. No. 667,896, Jun. 20, 1996.

[51] Int. Cl.$^6$ .................... G08C 15/06; G08C 19/20
[52] U.S. Cl. ................ 340/870.02; 375/206; 370/320
[58] Field of Search ............... 340/870.02, 870.18, 340/870.26; 375/206, 200; 455/71; 370/320

[56] References Cited

U.S. PATENT DOCUMENTS

| | | | |
|---|---|---|---|
| 4,322,842 | 3/1982 | Martinez | 370/11 |
| 4,614,945 | 9/1986 | Brunius et al. | 340/870.03 |
| 4,636,950 | 1/1987 | Caswell et al. | 364/403 |
| 4,639,728 | 1/1987 | Swanson | 340/870.03 |
| 4,713,837 | 12/1987 | Gordon | 379/93 |
| 4,862,493 | 8/1989 | Venkataraman et al. | 379/107 |
| 4,940,976 | 7/1990 | Gastouniotis et al. | 340/870.02 |
| 5,005,125 | 4/1991 | Farrar et al. | 364/403 |
| 5,056,107 | 10/1991 | Johnson et al. | 375/1 |
| 5,194,860 | 3/1993 | Jones et al. | 340/370.02 |
| 5,216,623 | 6/1993 | Barrett et al. | 364/550 |
| 5,299,227 | 3/1994 | Rose | 340/825.54 |
| 5,383,134 | 1/1995 | Wrzesinski | 364/514 |
| 5,438,329 | 8/1995 | Gastouniotis et al. | 340/870.02 |
| 5,450,492 | 9/1995 | Hook et al. | 380/28 |
| 5,451,938 | 9/1995 | Brennan, Jr. | 340/870.14 |
| 5,475,384 | 12/1995 | Manenti et al. | 340/870.04 |
| 5,481,259 | 1/1996 | Bane | 340/870.03 |
| 5,485,148 | 1/1996 | Tseng | 340/825.54 |
| 5,541,589 | 7/1996 | Delaney | 340/870 |
| 5,553,094 | 9/1996 | Johnson et al. | 375/200 |
| 5,654,978 | 8/1997 | Vanderpool et al. | 375/200 |

*Primary Examiner*—Michael Horabik
*Assistant Examiner*—Timothy Edward, Jr.
*Attorney, Agent, or Firm*—Terry J. Anderson; Karl J. Hoch, Jr.

[57] ABSTRACT

In a method for transmitting a desired parameter to a remote location, the desired parameter is first communicated to a base transmitter. Then, the base transmitter transmits a first radio signal therefrom having an unknown center frequency within a known frequency band. The first radio signal comprises information representative of the desired parameter. At a remote location, a remote receiver identifies the center frequency of the first radio signal and tunes the remote receiver to the center frequency thereof so as to facilitate reception of the first radio signal with the remote receiver. The information representative of the desired parameter may then be communicated to a desired destination.

10 Claims, 5 Drawing Sheets

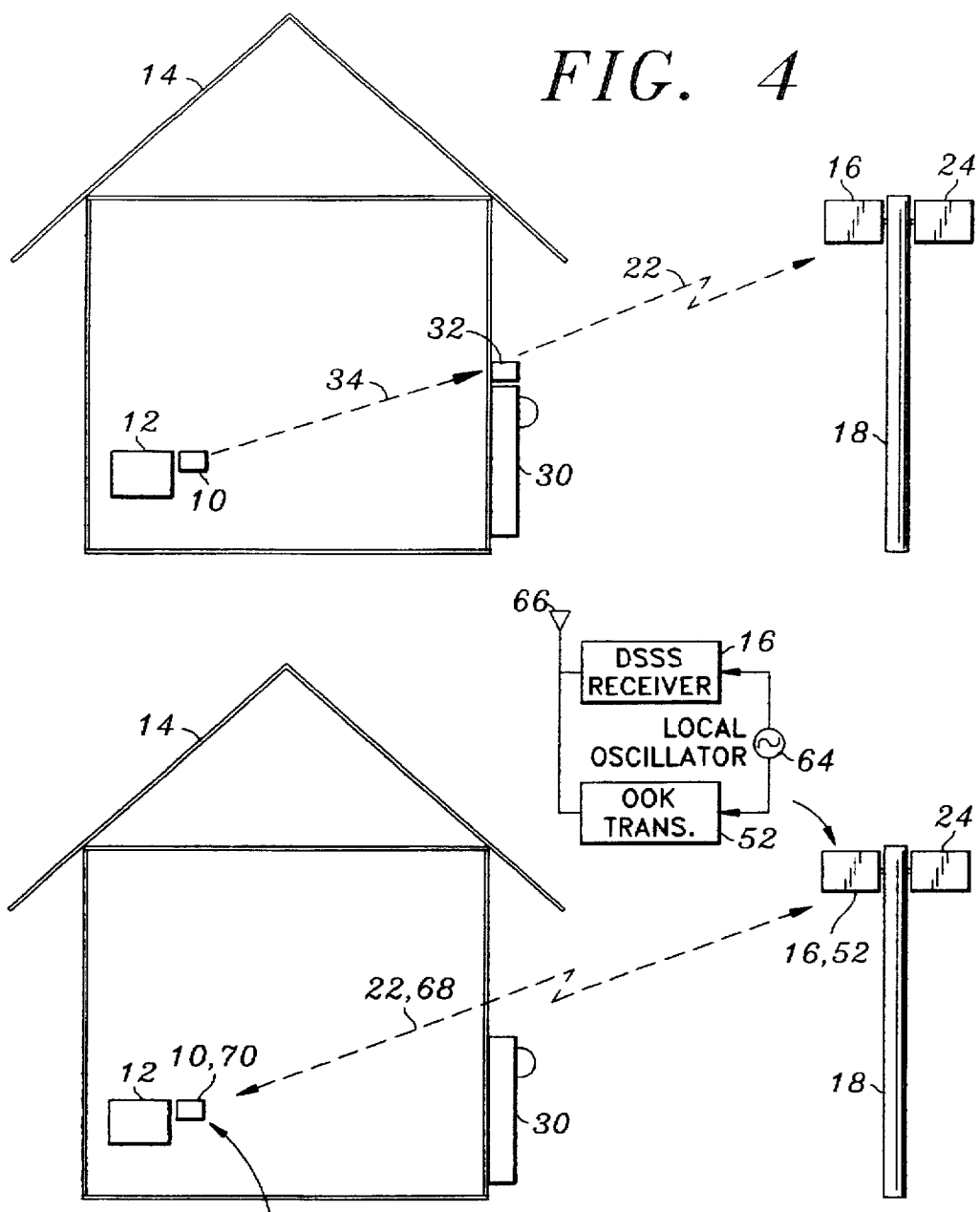
FIG. 4
FIG. 5
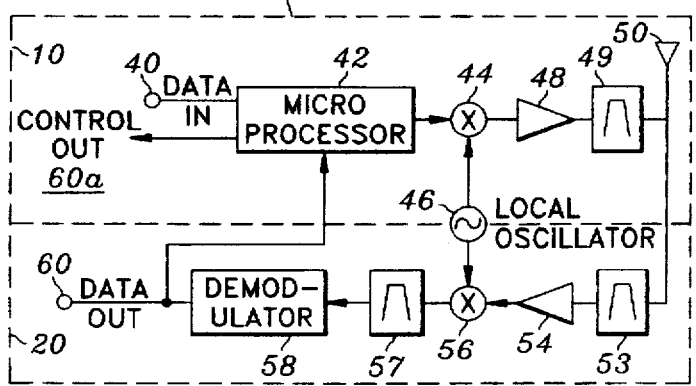

REMOTE UTILITY METER READING SYSTEM

RELATED APPLICATIONS

This patent application is a continuation-in-part patent application of U.S. Ser. No. 08/667,896, filed Jun. 20, 1996, and entitled RANDOM INTERVAL INVENTORY SYSTEM.

FIELD OF THE INVENTION

The present invention relates generally to utility meter reading and more particularly to a system for transmitting a utility meter reading or the like to a remote location, thereby mitigating the prior art need to have a person individually read each separate utility meter in a given neighborhood.

BACKGROUND OF THE INVENTION

Utility meters for providing an indication of the consumption of a utility by a particular residence or business are well known. Such utility meters allow a meter reader (a person responsible for reading the utility meters) to visually observe an indication of the amount of the utility consumed since the previous utility meter reading. Such utility meters are commonly used by electric companies, gas companies, and water companies.

As those skilled in the art will appreciate, the costs associated with employing meter readers is substantial. In view of the substantial costs associated with employing a person to manually read utility meters, various attempts have been made in the prior art to automate meter reading.

For example, U.S. Pat. No. 5,194,860 issued on Mar. 16, 1993 to Jones et al., entitled RADIO TELEMETRY SYSTEMS WITH CHANNEL SELECTION discloses a radio telemetry system for collecting the readings of consumers' electricity meters. The system includes a master station carried by a vehicle and a plurality of transceivers, each of which stores an electrical quantity indicative of the amount of electrical power consumed as measured by the meter associated with that particular transceiver. The transceivers and the master station communicate such that the transceivers transmit to the master station signals containing information as to the values of the electrical quantities stored therein.

However, although the Jones et al. system does eliminate the need for the meter reader to individually view each utility meter, it still requires that the master station, which is carried by a vehicle, be driven through the neighborhood, within the range of each transceiver, so as to effect meter reading. Thus, although Jones et al. does substantially simplify meter reading, it still has the inherent disadvantage of requiring the employment of personnel to effect meter reading.

Various attempts have also been made to transmit a signal indicative of the meter reading to a central location. Such prior art attempts have included an arrangement in which communication is carried out using the power transmission line of the electric utility. However, significant technical difficulties have been encountered in attempting to communicate along the electrical power line.

An attempt has also been made to utilize pre-existing telephone lines for such communication. However, use of the telephone lines provides a significant disadvantage since it relies heavily upon other parties, e.g., the telephone company, for implementing the system. Utility companies are apparently reluctant to use a system which they cannot entirely control and manage themselves.

Another system, which utilizes radio communications, was developed by Data Beam, which was a subsidiary of Connecticut Natural Gas. According to this prior art system, a meter reading device is mounted on the meter with a transmitting antenna which is separate from the meter reading device. The transmitting antenna is located on the building or other part of the installation site, thus enabling the antenna to transmit over a relatively large distance. The Data Beam system uses a number of receiving units, each arranged to receive data from a large number of transmitters, typically in the range of 10,000 to 30,000.

However, this arrangement results in the generation of a significant number of installation problems, typically due to wiring the antenna through the building to the transmitter and receiver. Further, the anticipated high level of power use required for transmitting is expected to involve either undesirably expensive battery systems or undesirably expensive wiring.

Another system utilizing radio communications is disclosed in U.S. Pat. No. 5,553,094 issued to Johnson et al. on Sep. 3, 1996 and entitled RADIO COMMUNICATION NETWORK FOR REMOTE DATA GENERATING STATIONS. Johnson et al. discloses a hierarchical network defining a wide area communications system for communicating meter readings to a central location.

One problem typically associated with such prior art radio communication systems is that of the cost associated with providing a large number of transmitters. As those skilled in the art will appreciate, the cost of providing a large number of such transmitters, particularly when such transmitters are constructed so as to transmit the radio signals on a precise, predetermined radio frequency, is substantial. Thus, it would be desirable to provide a system which mitigates the need to have a person individually read a large number of utility meters and which is not prohibitively expensive to install and maintain. More particularly, it would be beneficial to provide means for constructing such a system wherein the cost of each transmitter is substantially reduced, thereby dramatically decreasing the overall cost of the system.

SUMMARY OF THE INVENTION

The present invention specifically addresses and alleviates the above-mentioned deficiencies associated with the prior art. More particularly, the present invention comprises a method and apparatus for transmitting a desired parameter, e.g., a utility meter reading, to a remote location such as a central billing office. The system comprises a base transmitter to which the utility meter reading is communicated and which is utilized for transmitting a first radio signal therefrom. The first radio signal has an unknown center frequency within a known frequency band and comprises information representative of the utility meter reading.

It is to be understood that the preferred embodiment of the present invention comprises a system for transmitting utility meter readings to a remote location. However, as those skilled in the art will appreciate, various different desired parameters may similarly be transmitted. For example, the temperature of a room, the temperature of a freezer or oven, the level of liquid in a tank, the status of a machine or computer, etc. may similarly be transmitted. Thus, the use of utility meter reading herein is by way of example only and not by way of limitation.

A remote receiver, positioned a distance away from the utility meter and its associated base transmitter, is configured to identify the center frequency of the first radio signal and to tune to the center frequency of the first radio signal so as to facilitate reception of the first radio signal. As those skilled in the art will appreciate, various scanning devices are suitable for scanning within a predetermined band or frequency range, so as to determine the center frequency of a received signal.

An output circuit of the remote receiver communicates information representative of the utility meter reading from the remote receiver to a desired destination, such as a central billing office.

According to the preferred embodiment of the present invention, each of the base transmitters (one base transmitter being utilized to transmit a meter reading from each meter) is constructed of low cost components. This results in the output frequency of each base transmitter drifting substantially, within a predetermined band or range of frequencies, thus requiring the use of a scanner to determine the center frequency of each radio signal being received. However, because of the large number of individual base transmitters utilized, it is cost effective to provide a single scanner for each remote receiver, rather than constructing each base transmitter with components having sufficient tolerances to ensure stable transmission. Thus, each remote receiver compensates for inadequate accuracy in the transmissions of the base transmitters.

Thus, according to the preferred embodiment of the present invention, each base transmitter comprises an oscillator which drifts in frequency so as to provide a first radio signal having an unknown signal frequency. The oscillator preferably drifts in frequency so as to define a frequency band having a bandwidth of approximately 1 MHz.

Further, according to the preferred embodiment of the present invention, a timing circuit effects transmission of the first radio signal at either a random interval or a pseudo-random interval, so as to mitigate communications contention and so as to conserve power. Communications contention is mitigated since the use of such a random or pseudo-random transmission interval substantially reduces the likelihood that two base transmitters will transmit to a single remote receiver at the same instant. Indeed, if two base transmitters were to transmit to the same remote receiver at the same instant, both such transmissions would be ignored and it is extremely unlikely that subsequent retransmissions of the two base transmitters would occur at exactly the same instant again, since the time intervals between transmissions are either random or pseudo-random in nature.

The battery power of the base transmitter is conserved by utilizing a random or pseudo-random transmission interval protocol, as compared to a polling protocol, since when a random or pseudo-random timing interval is utilized an associated receiver does not have to be powered up and waiting to be polled. Thus, substantial power is only utilized during the brief interval of transmission.

The base transmitter preferably comprises a circuit for transmitting a direct sequence spread spectrum radio signal. As those skilled in the art will appreciate, it is possible to maximize the effective range of such a transmitter, without requiring FCC licensing, via the use of direct sequence spread spectrum modulation.

Optionally, a remote transmitter is in electrical communication with the base receiver and a remote receiver is in electrical communication with the base transmitter. The remote transmitter transmits a second radio signal to the base receiver. The second radio signal comprises a verification that the first radio signal has been properly received by the remote receiver and/or provides instructions for regulating the operation of at least one device. Such as the utility meter itself or a device serviced by the utility metered thereby.

The use of such a verification signal (the second radio signal) facilitates the immediate retransmission of the first radio signal in the event that it was not properly received by the remote receiver.

Thus, the present invention may optionally be utilized to regulate the operation of one or more devices which consume the utility being monitored by the utility meter. For example, during periods of peak electrical power consumption, high consumption devices, such as air conditioners, may be shut down or may be commanded to operate at reduced capacity. Of course, the regulation of such devices is typically more appropriate in industrial settings, where the power consumption is generally substantially greater and wherein operations, such as manufacturing activities, may potentially be postponed.

The remote transmitter, as utilized, preferably transmits via pulse position modulation (PPM). As used herein, the term pulse position modulation is defined as the modulation of a radio signal which comprises the transmission of a synch pulse followed by at least one data pulse wherein the time interval between the synch pulse and the data pulse(es) determines the character so transmitted. As those skilled in the art will appreciate, pulse position modulation tends to optimize range for a given average output power.

The use of pulse position modulation having a duty cycle of less than one percent eliminates the requirement for FCC licensing by maintaining a 50 mV/M measured at 10 meters output of less than average. According to the preferred embodiment of the present invention, the base transmitter is configured to transmit the first radio signal using direct sequence spread spectrum (DSSS) at a power of 30 dBm peak or less. Thus, PPM and DSSS provide adequate range while not requiring FCC licensing.

The information representative of the utility meter reading may be forwarded by the remote receiver by any one of a different number of systems, as desired. For example, the remote receiver may utilize the conventional telephone system, the cellular telephone system, or a satellite communication system to relay meter readings and the like to a central billing office. Control signals may similarly be transmitted from the central billing office to the remote transmitter, such that the control signals may be forwarded to the appropriate devices associated with the base transmitter so as to effect the regulation of a utility meter or device co-located therewith.

Preferably, the first radio signal comprises an identification code for the utility meter, so as to associate the meter reading therewith. Optionally, the base transmitter further comprises a circuit for providing information representative of the status of a device, such as the utility meter, so as to facilitate control thereof.

The remote receiver is preferably disposed upon a light pole, utility pole, chimney, or other high structure, so as to facilitate radio communication between the remote receiver and the plurality of base transmitters.

According to the preferred embodiment of the present invention, the base transmitter is configured to transmit the first radio signal such that the first radio signal has a duration of less than approximately 100 msec so as to mitigate the communications contention. Further, the base transmitter is preferably configured so as to transmit the first radio signal at a time which is staggered, e.g., via the use of random or pseudo-random time intervals as discussed above, relative to the times at which the other radio signals from other transmitters are transmitted, so as to further mitigate the communications contention.

Optionally, a data compression circuit in electrical communication with the remote receiver compresses data representative of the first radio signal and stores the compressed data. The compressed data is then communicated to the desired destination at a time when the telephone rates are favorable. The compressed data is then decompressed at the desired destination, e.g., central billing office, and utilized as desired.

Similarly, data may be compressed in the base transmitter prior to transmission. The transmitter is optionally configured to transmit the first radio signal on a more timely or near real time basis such as approximately once per hour so as to facilitate more precise monitoring of utility use. This data may be utilized to effect control of the devices consuming the monitored utility in an attempt to enhance the overall efficiency thereof or to mitigate peak usage loads.

According to an alternative configuration of the present invention, the base transmitter is battery powered and a relay transceiver disposed at an intermediate location with respect to the base transmitter and the remote receiver receives the first radio transmission from the base transmitter and retransmits the data from the first radio signal from the intermediate location to the remote receiver. The relay transceiver is powered by an electrical utility. Preferably, the relay transceiver is disposed proximate the electric meter and utilizes electrical power received therefrom to facilitate its operation thereof. As such, the use of such a relay transceiver reduces the power drain placed upon the batteries of one or more base transmitters which transmit therethrough, thereby enhancing the battery life of the base transmitters.

When such a relay transceiver is utilized, each base transmitter transmitting thereto is preferably configured to transmit a first radio signal via pulse position modulation and the relay transceiver is preferably configured to transmit the radio signal from the intermediate location to the remote receiver via direct sequence spread spectrum modulation.

The first radio signal is preferably transmitted from the base transmitter to the relay transceiver via pulse position modulation utilizing on-off keying. As those skilled in the art will appreciate, a maximum average of −1 dBm effective radiated power is permitted by the FCC when using on-off keying modulation in an unlicensed band. Thus, each base transmitter may utilize up to −1 dBm effective radiated power to transmit the first radio signal to its associated relay transceiver.

According to an alternative configuration of the present invention, functions of the base transmitter and the relay transceiver are combined such that a single enhanced base transmitter is provided which receives information representative of a utility meter reading, for example, and transmits that information to a remote receiver. The enhanced base transmitter receives electrical power from an electrical utility, as does the relay transceiver discussed above, and therefore does not require batteries.

Such an enhanced base transmitter finds particular application in industrial settings wherein large quantities of the monitored utilities are typically consumed. In such industrial applications, a receiver is preferably associated with the base transmitter so as to receive control signals from a remote transmitter. Such control signals may be utilized to control the activities of devices which consume the monitored utility, so as to enhance the efficiency of the utility distribution system and mitigate peak utility consumption, particularly during those times when many users are consuming that particular utility.

Thus, as discussed in detail above, information representative of utility meter readings and the like is communicated either directly from the base transmitter to the remote transmitter or, alternatively, is communicated from the base transmitter to a relay transceiver which does not rely upon battery power (as does the associated base transmitter) and which then retransmits the information to the remote receiver. These communications all represent the transfer of data from the base transmitter to the remote transmitter. However, as discussed briefly above, it is also frequently desirable to transmit data from a remote location, e.g., a central billing office or the like, to the base transmitters associated with the utility meters. Such reverse communication would allow for individual control of the utility meter and also so as to facilitate the performance of various different activities by the base transmitter. For example, the base transmitter may be instructed to transmit at different times, different time intervals, or utilizing a different random or pseudo-random algorithm. The utility meter may also be instructed to terminate the utility for non-paying customers, for example.

A selectable IF (intermediate frequency) is utilized in the relay transceiver to facilitate the reception of radio signals from either the base transmitter or the remote transmitter. The IF filter of the relay transceiver remains in a wideband mode of operation while listening for a transmitted first radio signal from a base transmitter. The bandwidth of the IF of the relay transceiver is preferably approximately 2 MHz so as to accommodate the known frequency band of +/−1 MHz of the base transmitters which is due to oscillator drift. As mentioned above, the use of low-cost oscillators in each of the base transmitters substantially reduces the overall cost of the system, but results in the transmission of a first radio signal having an unknown center frequency within a known frequency band, e.g., of approximately +/−1 MHz. In order to compensate for oscillator drift in the base transmitters, the relay transceivers, which are substantially fewer in number, must be able to receive signals within the wide bandwidth, e.g., approximately 2 MHz.

When the relay transceiver is listening for a radio transmission from a remote transmitter, it is placed in a narrowband mode, preferably having a bandwidth of approximately 30 kHz. Switching the relay transceiver into the narrowband mode enhances the sensitivity of its receiver by 18 dB, thus allowing it to receive radio signals from remote transmitters at a substantially greater distance than it is capable of receiving radio signals from base transmitters. Of course, the larger the number of relay transceivers that a given remote transmitter can transmit to, the lower overall cost of the system. The local oscillators of both the base transmitter and the relay transceiver are offset by the intermediate frequency, which is common to both the base transmitter and relay transceiver.

Alternatively, cellular data modems may be disposed right at each utility meter itself, or proximate thereto. Each cellular data modem will then transmit a signal representative of the meter reading to the central billing office via the cellular telephone system. Optionally, a single cellular data modem may be in electrical communication with a plurality of different utility meters, and thus may be utilized to transmit signals representative of the plurality of utility meter readings.

As a further alternative, base transmitters for a plurality of different utility meters may transmit to a local receiver, i.e., within a single house or a small group of houses, which then utilizes a cellular data modem to transmit signals representative of a plurality of utility meter readings to the central billing office via the cellular network.

According to the present invention, a system is provided which facilitates remote utility meter reading or the like and which utilizes a large number of low-cost base transmitters for transmitting information representative of the utility meter reading while utilizing a much smaller number of more sophisticated, more expensive remote receivers capable of receiving the unstable transmission frequencies from the base transmitters.

These, as well as other advantages of the present invention will be more apparent from the following description and drawings. It is understood that changes in the specific structure shown and described may be made within the scope of the claims without departing from the spirit of the invention.

BRIEF DESCRIPTION OF THE DRAWINGS

FIG. 2 is a schematic representation of a base transmitter associated with a utility meter which transmits a first radio signal representative of the utility meter reading directly to a remote receiver disposed upon a utility pole or the like;

FIG. 4 is a schematic representation of a base transmitter associated with a utility meter which transmits a first radio signal representative of the utility meter reading to a relay transceiver, the relay transceiver then relaying the data to a remote receive disposed upon a utility pole or the like;

FIG. 5 shows the schematic representation of FIG. 2 and includes further detail of the base transmitter and remote receiver;

DETAILED DESCRIPTION OF THE PREFERRED EMBODIMENT

The detailed description set forth below in connection with the appended drawings is intended as description of the presently preferred embodiment of the invention and is not intended to represent the only form in which the present invention may be constructed or utilized. The description sets forth the functions and the sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

The utility meter reading system of the present invention is illustrated in FIGS. 1–7 which depict a presently preferred embodiment thereof.

Figure 1:
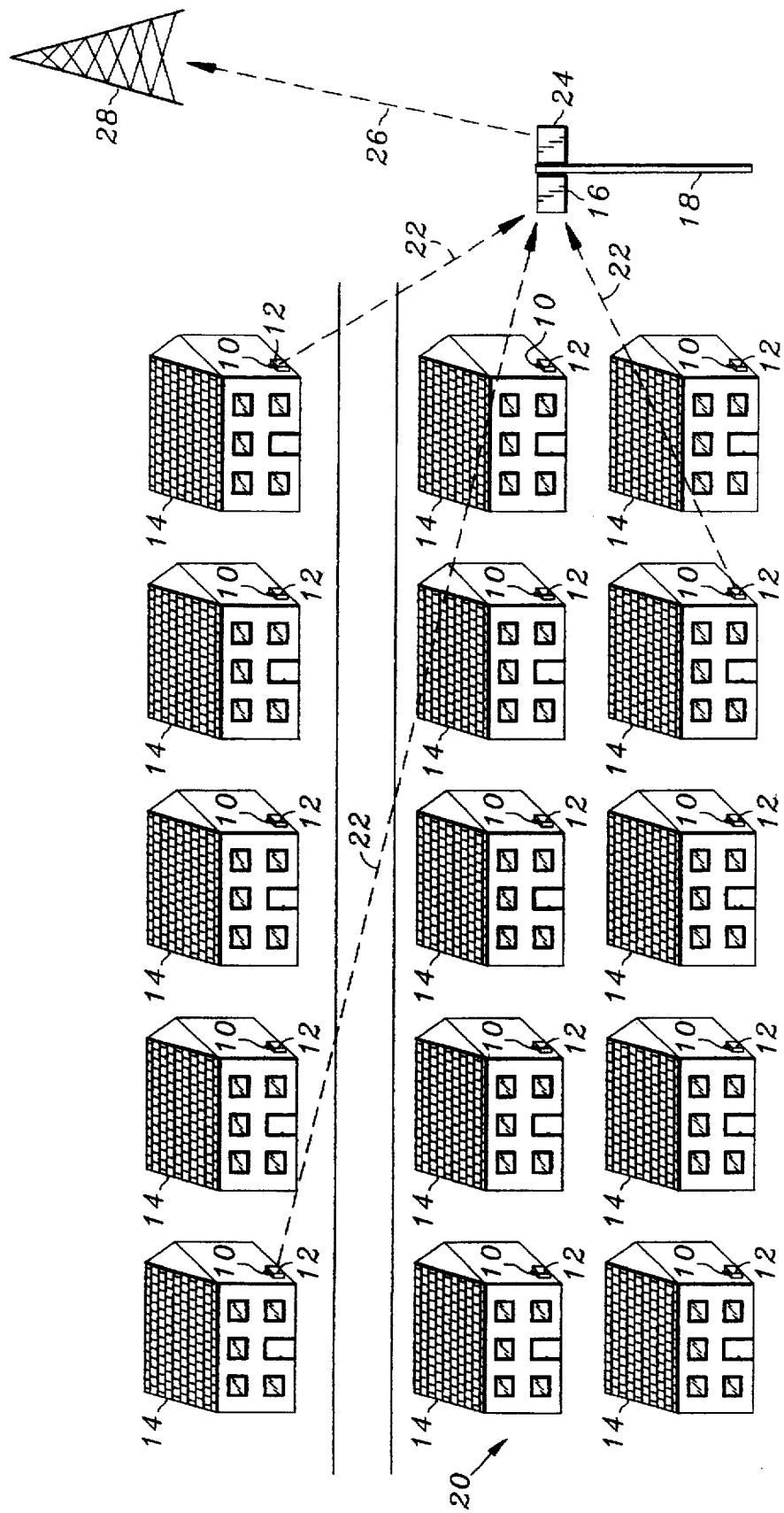
FIG. 1 is a schematic representation of a neighborhood wherein each house has a base transmitter associated with at least one utility meter thereof for transmitting information representative of the utility meter reading to a remote receiver disposed upon a utility pole or the like which then communicates the utility meter reading to a central billing office via a cellular telephone network.
Figure 2:
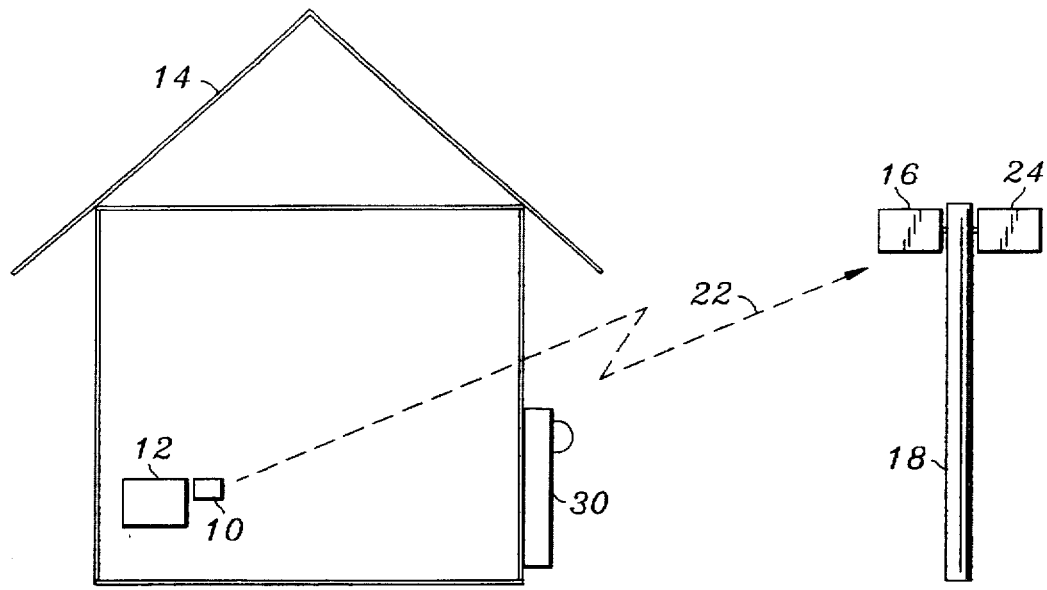

Referring now to FIGS. 1 and 2, the present invention generally comprises a plurality of base transmitters 10, each base transmitter 10 being associated with a utility meter 12.

Each base transmitter 10 is in communication with its associated utility meter 12, preferably via direct electrical connection thereto. Thus, each base transmitter 10 receives a signal representative of the reading of the utility meter 12, such that it may be transmitted therefrom as a first radio signal.

Optionally, a plurality of separate utility meters 12 may be connected to a single transmitter base 10. Thus, in a typical residence the electric, gas, and water meters may either each have their own, individual base transmitters 10, or may alternative be connected to a common base transmitter 10. As those skilled in the art will appreciate, various combinations of dedicated and shared base transmitters may be utilized, as desired.

Each base transmitter 10 is configured to transmit, preferably at different times from one another, a first radio signal 22 to a remote receiver 16 which is preferably disposed upon a utility pole, light pole, tower, or other comparatively high structure 18 which facilitates the reception of the first radio signal 22 from the base transmitters 10 in the neighborhood 20.

The remote receiver 16 is in electrical communication with a remote transmitter 24 which is configured to transmit the information representative of the utility meter reading to a desired destination, such as a central billing office, preferably via a cellular telephone signal 26 which is received by a cellular base station 28. Those skilled in the art will appreciate that various different methods for communicating the information contained in the first radio signal from the remote receiver 16 to the central billing office may be utilized. For example, hardwired telephone lines, cellular telephone lines, satellite communication, etc. may be utilized.

Thus, according to a first configuration of the present invention, a utility meter reading or the like is transmitted from a base transmitter 10 located in each home 14 to a remote receiver 16, typically located within or close to the neighborhood, preferably centrally located with respect thereto. The utility meter reading is then relayed to the central billing office via the most cost-effective means available.

In many instances it will be preferable to power the base transmitter 10 via batteries, since many utility meters are not located near an electrical power source, such as an electrical outlet of the residence. Thus, in order to avoid the expense of wiring the base transmitter 10 into the house's electrical wiring, replaceable batteries may be utilized. However, since such batteries must ultimately be removed and replaced, it is desirable to maximize their life by minimizing power consumption by the base transmitters 10. The power consumption of the base transmitters 10 is mitigated by the use of random or pseudo-random interval transmission and by the use of direct sequence spread spectrum modulation, as discussed in detail below.

Figure 3:
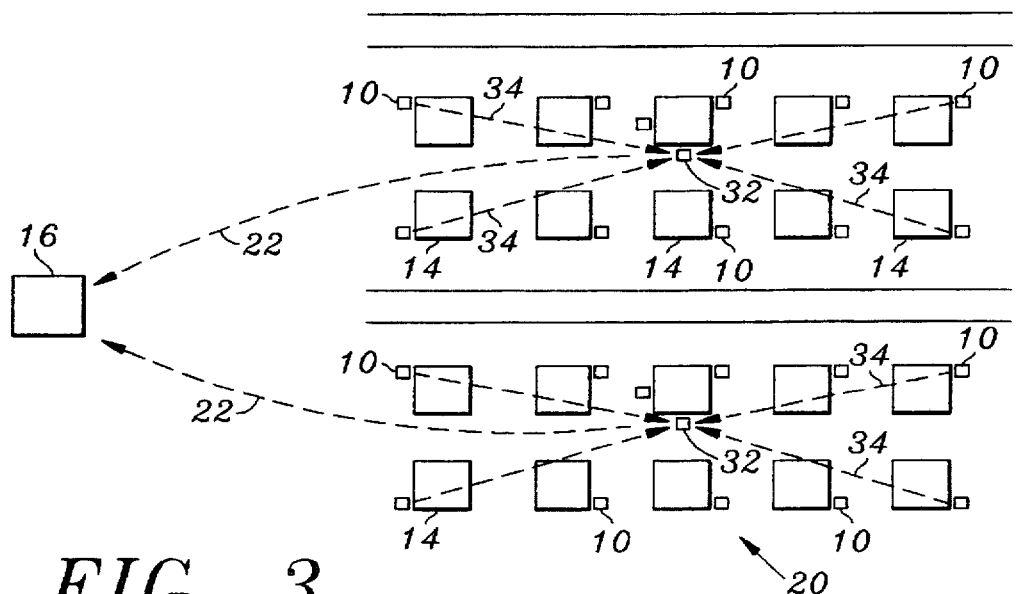
FIG. 3 is a schematic representation of a neighborhood wherein two relay transceivers are utilized to receive information representative of utility meter readings from base transmitters and to relay that information to a remote receiver.

Referring now to FIGS. 3 and 4, it will be appreciated that in some instances excessive battery consumption would be required in order to provide the power necessary to transmit from a base station 10 to the remote receiver 16. In such instances, it may be preferable to provide a relay transceiver so as to facilitate operation of the nearby base transmitters 10 within a desirable range of battery power consumption. Each relay transceiver 32 is powered by an electrical utility, i.e., house wiring, such that it does not depend upon a battery for power. Thus, the use of such a relay transceiver 32 further enhances the life of the batteries utilized to power each base transmitter 10 which transmits to the relay transceiver 32. Since each base transmitter 10 need only consume enough power to transmit the comparatively short distance to the relay transceiver 32, rather than the much longer distance to the remote receiver 16.

When such relay transceivers 32 are utilized, then each base transmitter 10 transmitting thereto is preferably configured to transmit utilizing position pulse modulation, which is a form of on-off keying. Thus, the radio signal 34 from the base transmitter 10 to the relay transceiver 32 preferably comprises a position pulse modulated radio signal utilizing on-off keying and the radio signal 22 from the relay transceiver 32 to the remote receiver 16 preferably comprises a direct sequence spread spectrum modulated signal.

Referring now to FIG. 5, each base transmitter 10 preferably comprises a data input port 40 which receives an electrical signal representative of the utility meter reading and provides that signal to a microprocessor 42. The microprocessor 42 encodes the utility meter reading, as desired, and also facilitates transmission thereof at a random or pseudo-random time interval. Modulator 44 accepts the output of microprocessor 42, i.e., a signal representative of the utility meter reading, and also accepts the output of the local oscillator 46 to effect modulation thereof. Power amplifier 48 boosts the output power of the radio frequency signal prior to its being transmitted via antenna 50. Bandpass filter 49 defines the broadcast bandwidth of the first radio signal 22.

Antenna 50 may likewise be utilized to receive a second radio signal, transmitted by a remote transmitter 52 which is filtered by bandpass filter 53 amplified via amplifier 54 and converted to an IF frequency via mixer 56, filtered by bandpass filter 57, and then provided to microprocessor 42 via demodulator 58. In an alternate embodiment, a separate receive and transmit antenna may be utilized. The data output from output 60 may then be utilized by the microprocessor 42 to effect control of the utility meter 12 and/or a device which is monitored thereby. A control signal may be utilized to change the length of the time interval at which utility meter reading are taken or to cause the utility meter 12 to shut down the utility being provided, as discussed above. Further, the data output signal may be utilized to modify operation of the monitored device, so as to reduce consumption of the monitored utility during peak usage, for example. The signal provided from the data output port 60 may also comprise a verification signal for effecting re-transmission of the utility meter reading when it has not been properly received by the remote receiver 16.

The remote receiver 16 and transmitter 52, preferably comprises an oscillator 64 which provides an output to both the direct sequence spread spectrum remote receiver 16 and the on-off key remote transmitter 52, both of which utilize antenna 66. The on-off key remote transmitter 52 facilitates the transmission of the second radio signal 68 therefrom to the base receiver 70.

Figure 6:
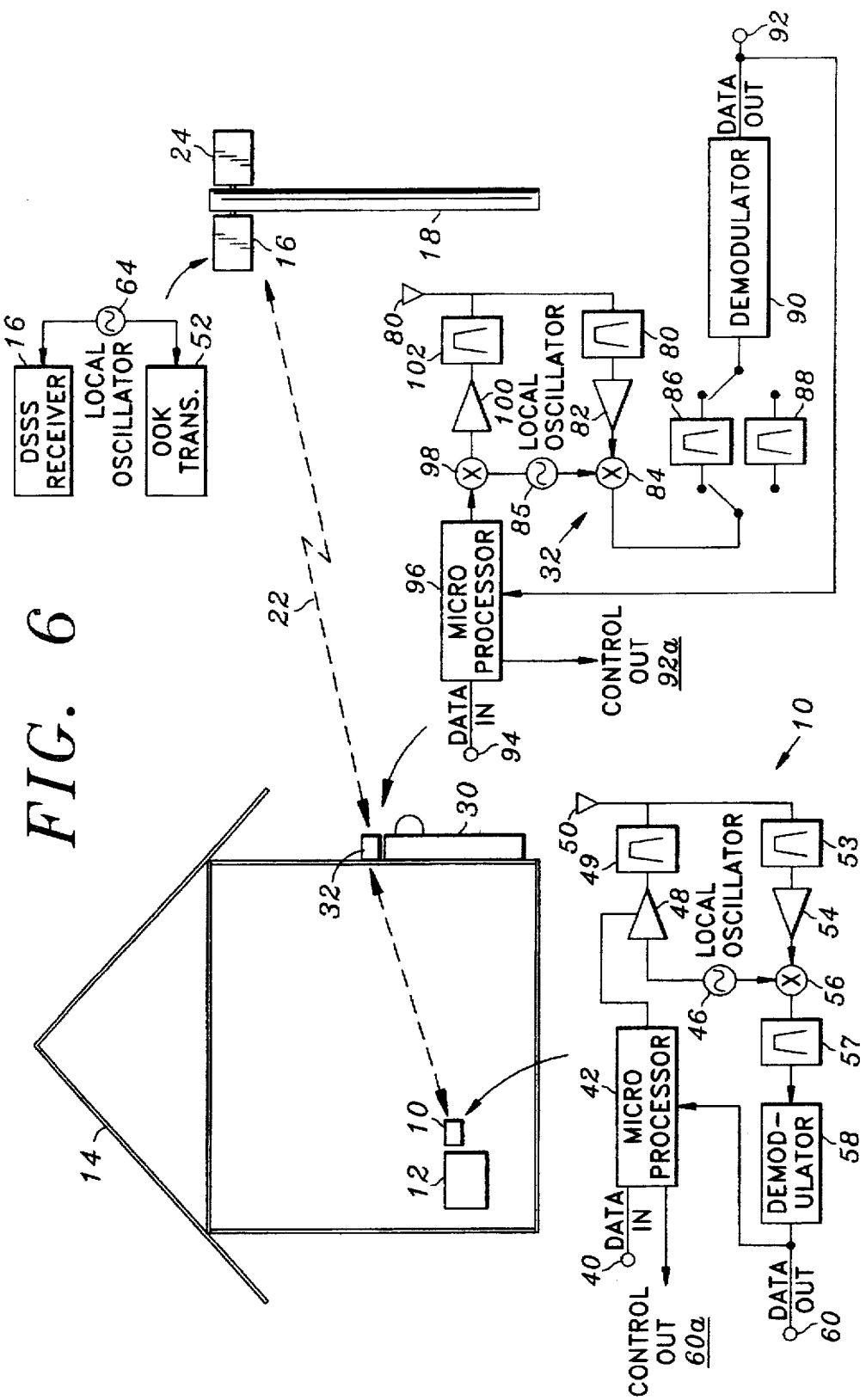
FIG. 6 shows the schematic representation of FIG. 4 and includes further detail of the relay transceiver.

Referring now to FIG. 6, the optional relay transceiver 32 preferably comprises an antenna 80 for both receiving and sending radio signals. An alternate embodiment uses separate receive and transmit antenna. Bandpass filter 81 passes frequencies within the bandwidth, typically several megaHertz, where the signal from the base transmitters 10 is located. Amplifier 82 amplifies the filtered radio frequency signal and mixer 84 converts the radio frequency signal to baseband. 1 MHz bandpass filter 86 provides broadband reception of the radio signal from the base transmitter 10, while narrowband filter 88 facilitates reception thereof after and the demodulator 90 provides the data output from output port 92 to the microprocessor 96. Data to be re-transmitted, such as that from data input port 94, is provided to the microprocessor 96. In the preferred embodiment, the relay transceiver switches the local oscillator 85 frequency to a different frequency when in wide or narrowband reception. Microprocessor 96 encodes the data, as desired, and facilitates transmission thereof at a desired time. The data to be transmitted is output from microprocessor 96 through modulator 98, which utilizes local oscillator 85, to power amplifier 100. Bandpass filter 102 provides a signal of the desired frequency content to antenna 80.

According to the preferred embodiment of the present invention, each remote transmitter and receiver service a neighborhood having a radius of approximately one mile, thus covering approximately six square miles.

According to the preferred embodiment of the present invention, the on-off keying utilized to transmit from the base transmitter to the relay transceiver comprises a 2,408.3 MHz radio signal. This is received by the relay transceiver when the relay transceiver is in the wideband mode. The relay transceiver's local oscillator is preferably a 2,419 MHz oscillator which mixes the 2,408.3 signal down to the relay transceiver's IF at 10.7 MHz.

The relay transceiver receives the on-off key modulated radio signal from the base transmitter and relays it to the remote receiver using direct sequence spread spectrum modulation at 2,414 MHz. Prior to performing the transmission to the remote receiver, the relay transceiver switches to its narrowband IF filter.

The remote receiver receives the spread spectrum signal, demodulates it, and determines the center frequency of the transmission from the relay transceiver (or the base transmitter if no relay transceiver is utilized).

After determining the center frequency of the radio transmission from the relay transceiver 32, the remote receiver 16 adjusts for frequency drift thereof and can then transmit back to the relay transceiver 32 utilizing on-off key transmission at the correct frequency so that the transmission from the remote transmitter 24 to the relay transceiver can be properly received, i.e., its converted RF center frequency is within the relay transceiver IF bandwidth when the relay transceiver 32 is utilizing the narrowband filter thereof.

After receiving a radio transmission from the remote transmitter, the relay transceiver switches from direct or spread spectrum modulation to on-off key modulation and transmits to the base receiver at 2,413.545 MHz. The local receiver receives the 2,413.545 MHz signal and uses its 2,414 MHz local oscillator to mix the received radio signal down to 455 KHz IF for demodulation thereof.

When a relay transceiver 32 is utilized, then the circuitry of the base transmitter 10 is modified so as to accommodate the use of pulse position modulation utilizing on/off key transmission, rather than direct sequence spread spectrum modulation. Thus, as shown in FIG. 6, the microprocessor 42 provides its output directly to amplifier 48 where it controls passage of the oscillator signal 46 to the bandpass filter 49, thus effecting on/off keying.

Figure 7:
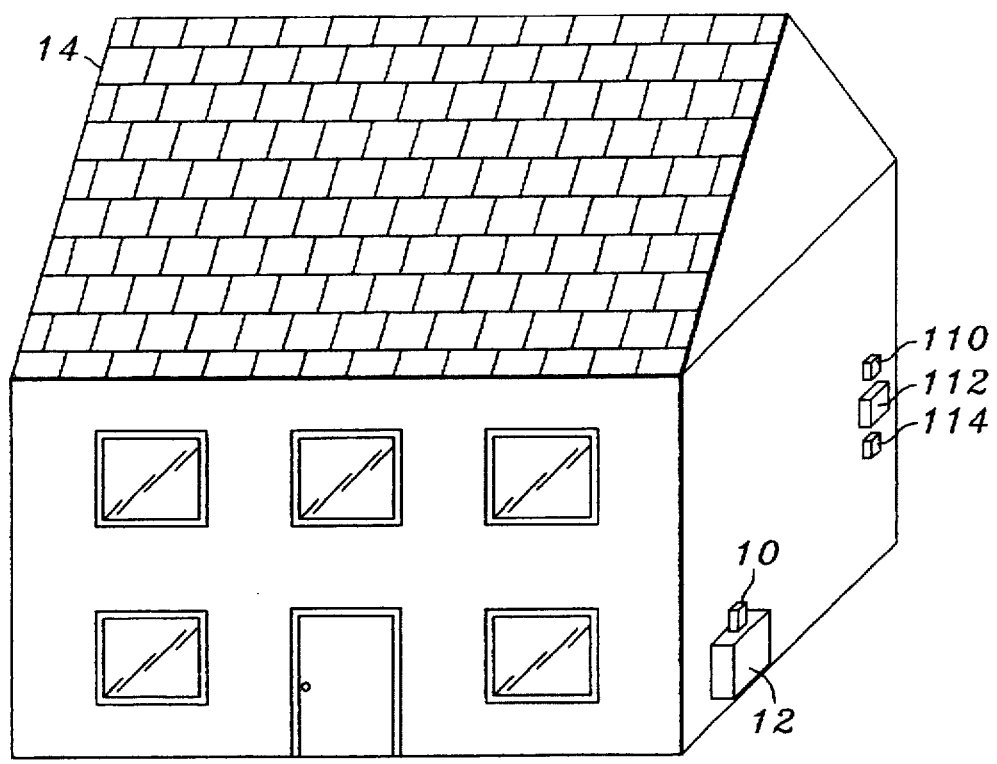
FIG. 7 is a schematic representation of a single home having a cellular data modem for receiving radio signals from at least one base transmitter so as to transmit a utility meter reading thereof to a central billing office via the cellular telephone network.

Referring now to FIG. 7, according to a further alternative configuration, the base transmitter 10 associated with each utility meter 12 of a residence, for example, transmits a radio signal representative of the meter reading to a receiver located within or near the house 14 which is interfaced to a cellular data modem 110 via telephone interface 112. The cellular data modem 110 then transmits the meter reading to the central billing office via the cellular system.

It is understood that the exemplary remote utility meter reading system described herein and shown in the drawings represents only a presently preferred embodiment thereof. Indeed, various modifications and additions may be made to such embodiment without departing from the spirit and scope of the invention. For example, those skilled in the art will appreciate various different protocols and modulation methods are suitable for the transmission of data between the base transmitter, relay transceiver, and the remote receiver. Also, various different parameters, other than utility meter readings, may be so transmitted. Thus, these and other modifications and additions may be obvious to those skilled in the art and may be implemented to adapt the present invention for use in a variety of different applications.

What is claimed is:

1. A method for transmitting a desired parameter from a base station to a remote location, the method comprising the steps of:
    a) transmitting a first radio signal via pulse position modulation from the base transmitter to a relay transceiver disposed at a location intermediated the base station and the remote location;
    b) receiving the first radio signal with the relay transceiver; and
    c) relaying the data via direct sequence spread spectrum modulation from the relay transceiver to the remote location.

2. The method as recited in claim 1, further comprising the step of transmitting a second radio signal from the remote location to the base station, the second radio signal comprising instructions for regulating operation of at least one device.

3. The method as recited in claim 1, wherein the step of transmitting a first radio signal comprises transmitting a first radio signal having a duration of less than approximately 100 milliseconds so as to mitigate communications contention.

4. The method as recited in claim 1, further comprising the steps of:
    a) compressing data representative of the desired parameter;
    b) storing the compressed data; and
    c) transmitting the compressed data to a desired location via telephone at a time when telephone rates are favorable.

5. The method as recited in claim 1, wherein the step of transmitting a first radio signal comprises transmitting a first radio signal representative of a utility meter reading.

6. A system for transmitting a desired parameter from a base station to a remote location, the system comprising:
    a) a base transmitter disposed at the base station and configured to transmit a first radio signal via pulse position modulation to a relay transceiver disposed at a location intermediated the base station and the remote location; and
    b) a relay transceiver configured to receive the pulse position modulated first radio signal and to relay the data via direct sequence spread spectrum modulation from the relay transceiver to the remote location.

7. The system as recited in claim 6, wherein the relay transmitter is configured to transmit a second radio signal from the remote location to the base station, the second radio signal comprising instructions for regulating operation of at least one device.

8. The system as recited in claim 6, wherein the base transmitter is configured to transmit a first radio signal having a duration of less than approximately 100 milliseconds so as to mitigate communications contention.

9. The system as recited in claim 6, further comprising:
    a) a circuit for compressing data representative of the desired parameter; and
    b) a memory for storing the compressed data;
    c) wherein compressing and storing the data facilitate subsequent transmission of the compressed data to a desired location via telephone at a time when telephone rates are favorable.

10. The system as recited in claim 6, wherein the base transmitter is configured to transmit a first radio signal representative of a utility meter reading.

* * * * *